US012733299B2

(12) United States Patent
Takemasa

(10) Patent No.: US 12,733,299 B2
(45) Date of Patent: Sep. 8, 2026

(54) DISPLAY DEVICE AND LIGHT EMITTING DIODE CHIP

(71) Applicant: Japan Display Inc., Tokyo (JP)

(72) Inventor: Kenichi Takemasa, Tokyo (JP)

(73) Assignee: Japan Display Inc., Tokyo (JP)

( * ) Notice: Subject to any disclaimer, the term of this patent is extended or adjusted under 35 U.S.C. 154(b) by 478 days.

(21) Appl. No.: 18/364,975

(22) Filed: Aug. 3, 2023

(65) Prior Publication Data

US 2024/0047617 A1 Feb. 8, 2024

(30) Foreign Application Priority Data

Aug. 8, 2022 (JP) ................................ 2022-126632

(51) Int. Cl.
*H10H 20/831* (2025.01)
*H10H 20/857* (2025.01)
*H10W 90/00* (2026.01)

(52) U.S. Cl.
CPC ...... *H10H 20/8312* (2025.01); *H10H 20/857* (2025.01); *H10W 90/00* (2026.01)

(58) Field of Classification Search
None
See application file for complete search history.

(56) References Cited

U.S. PATENT DOCUMENTS 8,575,643 B2 11/2013 Watanabe et al.
2020/0313059 A1* 10/2020 He ...................... H10H 20/857
2022/0045242 A1 2/2022 Ikeda et al.

FOREIGN PATENT DOCUMENTS

JP 2008-108816 A 5/2008
JP 2022-029226 A 2/2022

OTHER PUBLICATIONS

Japanese Office Action mailed on Dec. 23, 2025 for the corresponding Japanese Patent Application No. 2022-126632, with English machine translation.

* cited by examiner

*Primary Examiner* — Feifei Yeung Lopez
(74) *Attorney, Agent, or Firm* — Michael Best & Friedrich LLP

(57) ABSTRACT

An anode electrode includes a first recess portion which does not contact a first projection electrode and a first protruding portion which protrudes in a direction away from an insulating layer than the first recess portion and is in contact with the first projection electrode. A cathode electrode includes a second recess portion which does not contact a second projection electrode and a second protruding portion which protrudes in a direction away from the insulating layer than the second recess portion and is in contact with the second projection electrode. A space between the first recess portion and the first projection electrode communicates with a space around a connection portion between the anode electrode and the first projection electrode. A space between the second recess portion and the second projection electrode communicates with a space around a connection portion between the second electrode and the second projection electrode.

12 Claims, 9 Drawing Sheets

DSP1

20
20EK
34B
34A
34
VSL
D1
10b
20EA
33B
33A
33
10f
31
ES
50
GL(EG)
ED
SW
14
32
13
12
11
10
Z
Y

D1
20
22
24
25
22f
23
23T1
23T2
23H1
23H2
26D1
26D2
26L1
26L2
26W1
26W2
20EA
20EK
ET1
33
33A
33B
34
34A
34B
Z
Y

D1
20A
22
24
25
22f
23T3
23
20EA
26W1
ET1
23T2
20EK
26W2
23H2
26D2
26L2
23T1
23H1
26D1
26L1
33B
33A
33
34B
34A
34
Y
Z

DISPLAY DEVICE AND LIGHT EMITTING DIODE CHIP

CROSS REFERENCE TO RELATED APPLICATIONS

The present application claims priority to Japanese Patent Application No. 2022-126632 filed on Aug. 8, 2022, the disclosure of which is incorporated herein by reference.

TECHNICAL FIELD OF THE INVENTION

The present invention relates to a manufacturing technique of a display device.

BACKGROUND OF THE INVENTION

As a display device, there is an LED (Light Emitting Diode) display device in which inorganic light emitting diode elements which are self light emitting elements are arrayed in matrix on a substrate (see, for example, Patent Document 1 (Japanese Unexamined Patent Application Publication No. 2022-029226)). Patent Document 1 describes that there is a stepped portion between a position of an anode electrode and a position of a cathode electrode of an LED chip and a bump for the cathode electrode is provided so as to fill the stepped portion.

SUMMARY OF THE INVENTION

Each of a plurality of LED chips provided in an LED display device is mounted on a substrate called a backplane via a conductive bonding material such as solder. Each electrode of the LED chip is arranged at a position facing a terminal of the backplane, and an insulating layer is provided between the electrode and the diode element. The electrode and the diode element are electrically connected through a contact hole formed in the insulating layer. The studies by the inventor of this application have revealed that a region in which air is trapped is formed in the joint portion between the electrode and the conductive bonding material depending on the shape of the electrode. If the region in which air is trapped is formed in the joint portion between the electrode and the conductive bonding material, it causes a decrease in the reliability of the electrical connection between the LED chip and the backplane.

An object of the present invention is to provide a technique for improving the performance of a display device using a plurality of inorganic light emitting diode elements.

A display device according to one aspect of the present invention includes: a substrate having a first projection electrode and a second projection electrode; and a light emitting diode chip which has a first electrode arranged at a position facing the first projection electrode and a second electrode arranged at a position facing the second projection electrode and is mounted on the substrate. The light emitting diode chip includes: a semiconductor layer; a first insulating layer covering a first surface of the semiconductor layer; the first electrode formed on the first insulating layer; and the second electrode formed on the first insulating layer so as to be spaced apart from the first electrode. The first electrode is electrically connected to one of an anode and a cathode of a diode element through a first contact hole formed in the first insulating layer. The second electrode is electrically connected to the other of the anode and the cathode of the diode element through a second contact hole formed in the first insulating layer. The first electrode includes: a first recess portion which is formed at a position overlapping the first contact hole and does not contact the first projection electrode; and a first protruding portion which is formed at a position different from the first recess portion, protrudes in a direction away from the first insulating layer than the first recess portion, and is in contact with the first projection electrode. The second electrode includes: a second recess portion which is formed at a position overlapping the second contact hole and does not contact the second projection electrode; and a second protruding portion which is formed at a position different from the second recess portion, protrudes in a direction away from the first insulating layer than the second recess portion, and is in contact with the second projection electrode. A space between the first recess portion and the first projection electrode communicates with a space around a connection portion between the first electrode and the first projection electrode. A space between the second recess portion and the second projection electrode communicates with a space around a connection portion between the second electrode and the second projection electrode.

A light emitting diode chip according to another aspect of the present invention includes: a semiconductor layer in which a diode element is formed; a first insulating layer covering a first surface of the semiconductor layer; a first electrode formed on the first insulating layer; and a second electrode formed on the first insulating layer so as to be spaced apart from the first electrode. The first electrode is electrically connected to one of an anode and a cathode of the diode element through a first contact hole formed in the first insulating layer. The second electrode is electrically connected to the other of the anode and the cathode of the diode element through a second contact hole formed in the first insulating layer. The first electrode includes: a first recess portion which is formed at a position different from the first contact hole; and a first protruding portion which is formed at a position different from the first recess portion and protrudes in a direction away from the first insulating layer than the first recess portion. The second electrode includes: a second recess portion which is formed at a position different from the second contact hole; and a second protruding portion which is formed at a position different from the second recess portion and protrudes in a direction away from the first insulating layer than the second recess portion. A space in the first recess portion communicates with a space around the first electrode. A space in the second recess portion communicates with a space around the second electrode.

BRIEF DESCRIPTIONS OF THE DRAWINGS

DESCRIPTIONS OF THE PREFERRED EMBODIMENTS

Figure 1:
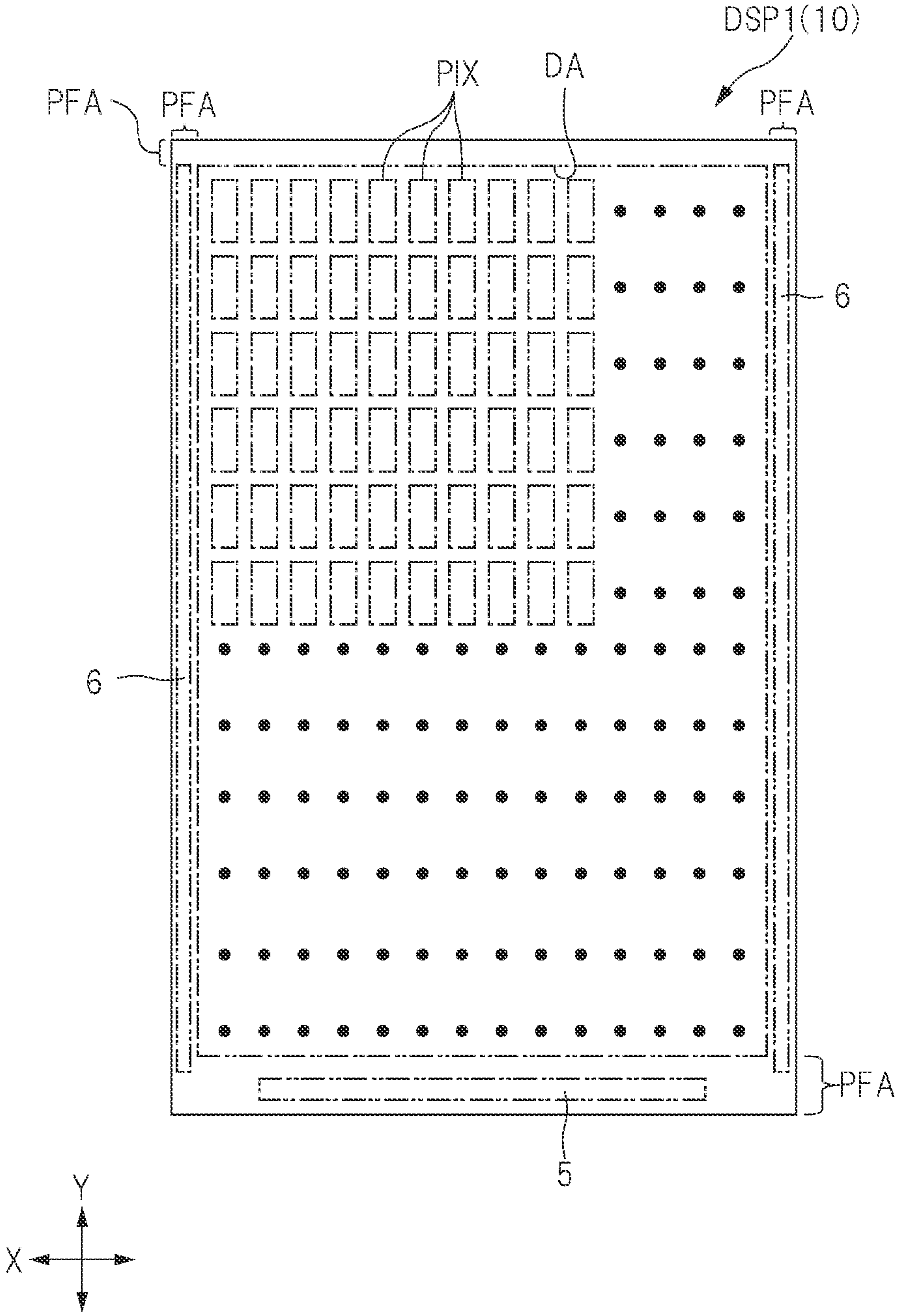
FIG. 1 is a plan view showing a configuration example of a display device according to one embodiment.

Hereinafter, each embodiment of the present invention will be described with reference to drawings. Note that the disclosure is mere an example, and it is a matter of course that any alteration that is easily made by a person skilled in the art while keeping a gist of the present invention is included in the range of the present invention. In addition, the drawings schematically illustrate a width, a thickness, a shape, and the like of each portion as compared with actual aspects in order to make the description clearer, but the drawings are mere examples and do not limit the interpretation of the present invention. Further, the same elements as those described in relation to the foregoing drawings are denoted by the same or related reference characters in this specification and the respective drawings, and detailed descriptions thereof will be omitted as appropriate.

In the following embodiment, a micro LED display device in which a plurality of micro LED chips are mounted will be described as an example of a display device in which a plurality of light emitting diode chips (hereinafter, referred to as LED chips) are mounted on a substrate.

<Display Device>

Figure 2:
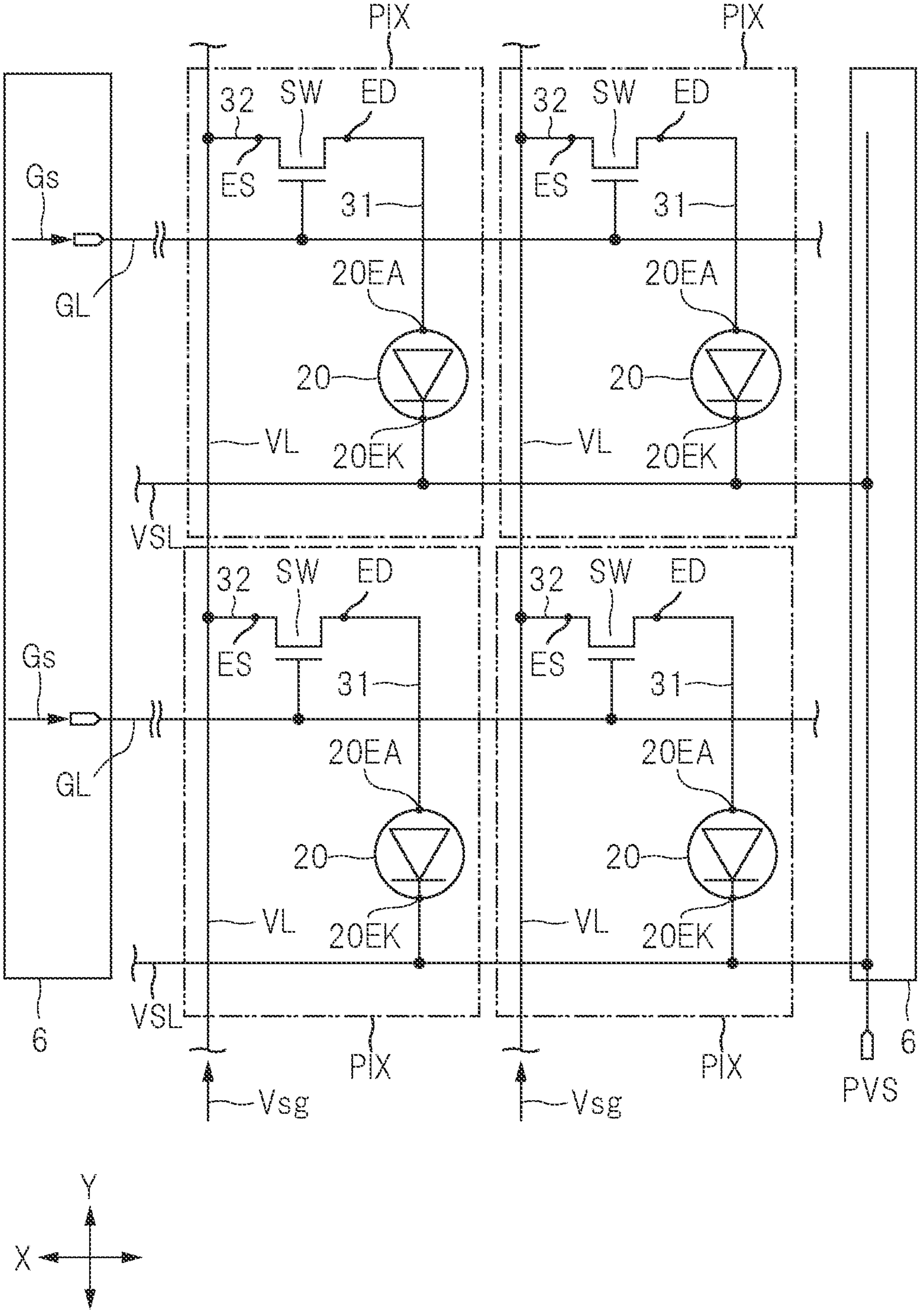
FIG. 2 is a circuit diagram showing a configuration example of a circuit around the pixels shown in FIG. 1.

First, a configuration example of a micro LED display device which is an electronic device according to the present embodiment will be described. FIG. 1 is a plan view showing a configuration example of a micro LED display device which is one embodiment of an electronic device. In FIG. 1, the boundary between a display region DA and a peripheral region PFA, a control circuit 5, a drive circuit 6, and a plurality of pixels PIX are indicated by dashed-two-dotted lines. FIG. 2 is a circuit diagram showing a configuration example of a circuit around the pixels shown in FIG. 1.

Figure 4:
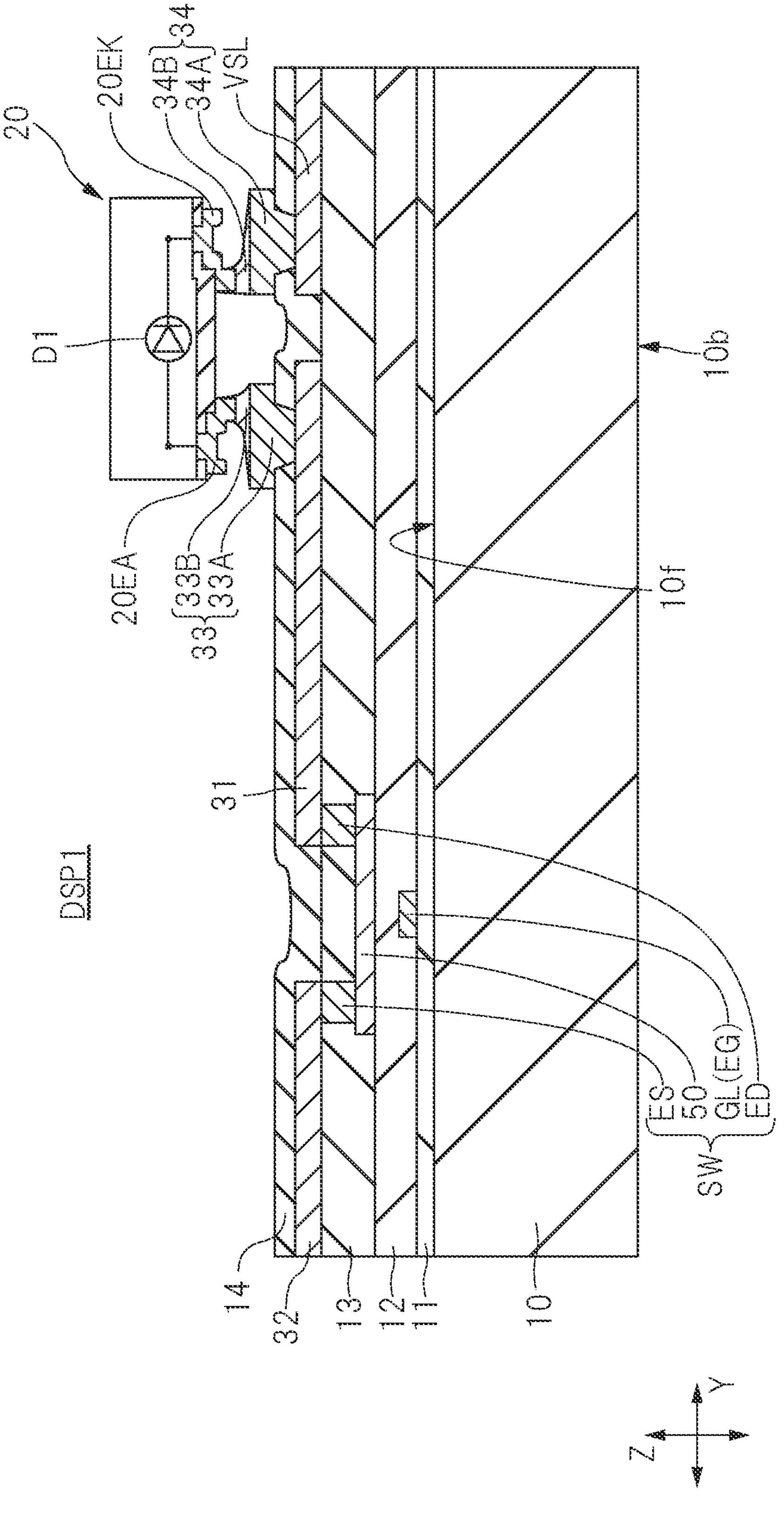
FIG. 4 is an enlarged cross-sectional view taken along the line A-A in FIG. 3.

As shown in FIG. 1, a display device DSP1 of the present embodiment includes the display region DA, the peripheral region PFA that surrounds the display region DA in a frame shape, and the plurality of pixels PIX arrayed in matrix in the display region DA. Further, the display device DSP1 includes a substrate 10, the control circuit 5 formed on the substrate 10, and the drive circuit 6 formed on the substrate 10. The substrate 10 is made of glass or resin. As shown in FIG. 4 which will be described later, the substrate 10 has a surface **10*f* and a surface on a side opposite to the surface 10*f***.

The control circuit 5 shown in FIG. 1 and FIG. 2 is a control circuit that controls the driving of a display function of the display device DSP1. For example, the control circuit 5 is a driver IC (Integrated Circuit) mounted on the substrate 10. In the example shown in FIG. 1, the control circuit 5 is arranged along one short side of the four sides of the substrate 10. Further, in the example of the present embodiment, the control circuit 5 includes a signal line drive circuit that drives wirings (video signal wirings) VL (see FIG. 2) connected to the plurality of pixels PIX. However, the position and configuration example of the control circuit 5 are not limited to the example shown in FIG. 1, and there are various modifications. For example, in FIG. 1, a circuit board such as a flexible board may be connected to the position shown as the control circuit 5, and the driver IC described above may be mounted on the circuit board. Further, for example, the signal line drive circuit that drives the wirings VL may be formed separately from the control circuit 5.

The drive circuit 6 includes a circuit that drives scanning signal lines GL (see FIG. 2 described later) of the plurality of pixels PIX. Further, the drive circuit 6 includes a circuit that supplies a reference potential to the LED chip mounted on each of the plurality of pixels PIX. The drive circuit 6 drives the plurality of scanning signal lines GL based on the control signal from the control circuit 5. In the example shown in FIG. 1, the drive circuit 6 is arranged along each of two long sides of the four sides of the substrate 10. However, the position and configuration example of the drive circuit 6 are not limited to the example shown in FIG. 1, and there are various modifications. For example, in FIG. 1, a circuit board such as a flexible board may be connected to the position shown as the control circuit 5, and the drive circuit 6 described above may be mounted on the circuit board.

Next, a circuit configuration example of the pixel PIX will be described with reference to FIG. 2. Although FIG. 2 shows four pixels PIX as representatives, each of the plurality of pixels PIX shown in FIG. 1 includes the circuit similar to that of the pixel PIX shown in FIG. 2. Hereinafter, the circuit including a switch and an LED chip 20 provided in the pixel PIX may be referred to as a pixel circuit. The pixel circuit is a voltage signal circuit that controls the light emitting state of the LED chip 20 in accordance with a video signal Vsg supplied from the control circuit 5 (see FIG. 1).

As shown in FIG. 2, the pixel PIX includes the LED chip 20. The LED chip 20 is a light emitting diode chip, specifically a micro light emitting diode chip. The LED chip 20 has an anode electrode 20EA and a cathode electrode 20EK. The cathode electrode 20EK of the LED chip 20 is connected to a wiring VSL to which a reference potential (fixed potential) PVS is supplied. The anode electrode 20EA of the LED chip 20 is electrically connected to a drain electrode ED of a switching element SW through a wiring 31.

The pixel PIX includes the switching element SW. The switching element SW is a transistor that controls the connection state (on or off state) between the pixel circuit and the wiring VL in response to a control signal Gs. The switching element SW is, for example, a thin film transistor. When the switching element SW is in the on state, the video signal Vsg is input to the pixel circuit from the wiring VL.

The drive circuit 6 includes a shift register circuit, an output buffer circuit, and others (not shown). The drive circuit 6 outputs a pulse based on a horizontal scanning start pulse transmitted from the control circuit 5 (see FIG. 1), and outputs the control signal Gs.

Each of the plurality of scanning signal lines GL extends in the X direction. The scanning signal line GL is connected to a gate electrode of the switching element SW. When the control signal Gs is supplied to the scanning signal line GL, the switching element SW is turned on, and the video signal Vsg is supplied to the LED chip 20.

<Peripheral Structure of LED Chip>

Figure 3:
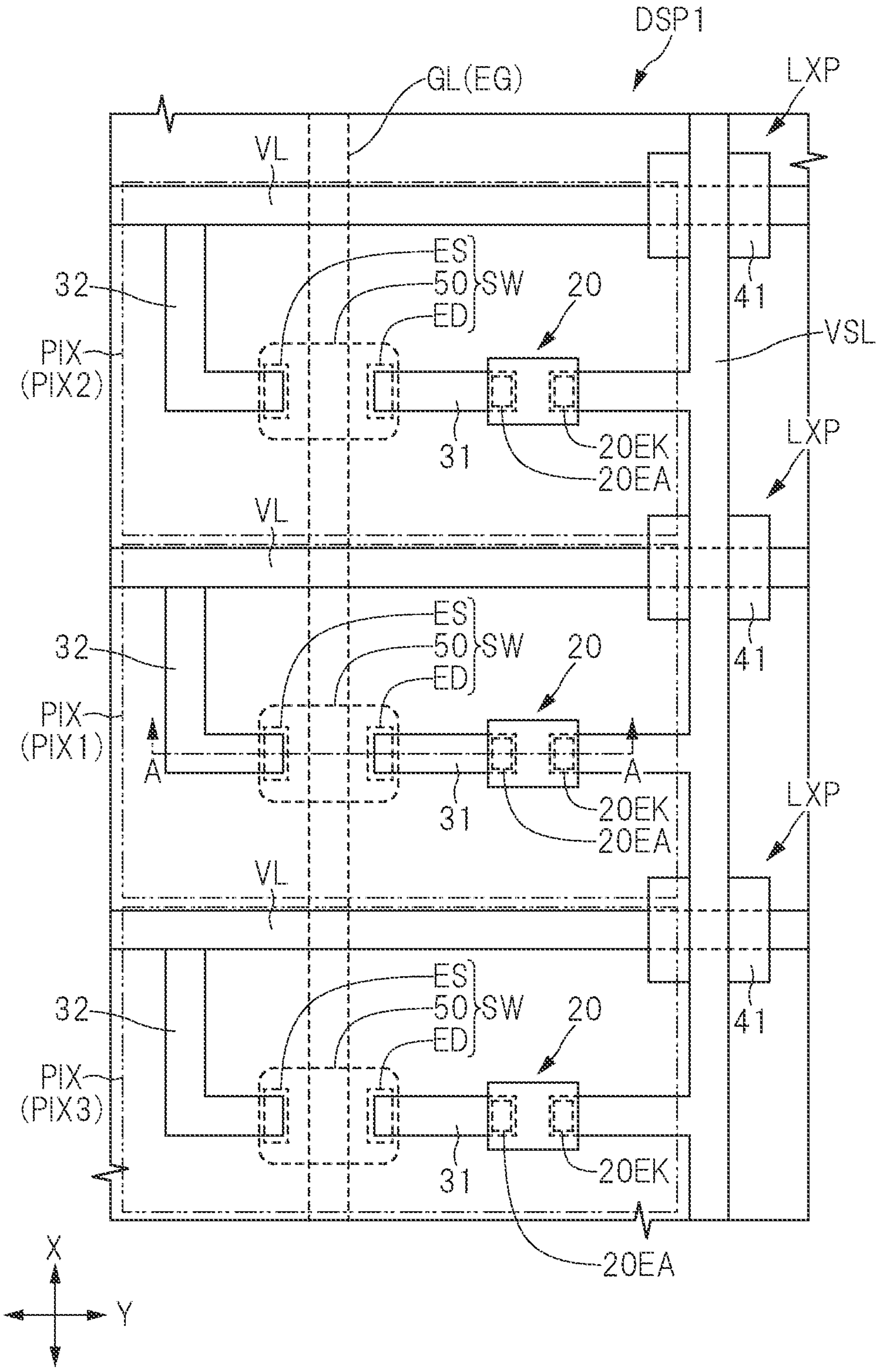
FIG. 3 is a transparent enlarged plan view showing an example of a peripheral structure of an LED chip arranged in each of the plurality of pixels of the display device shown in FIG. 1.
Figure 5:
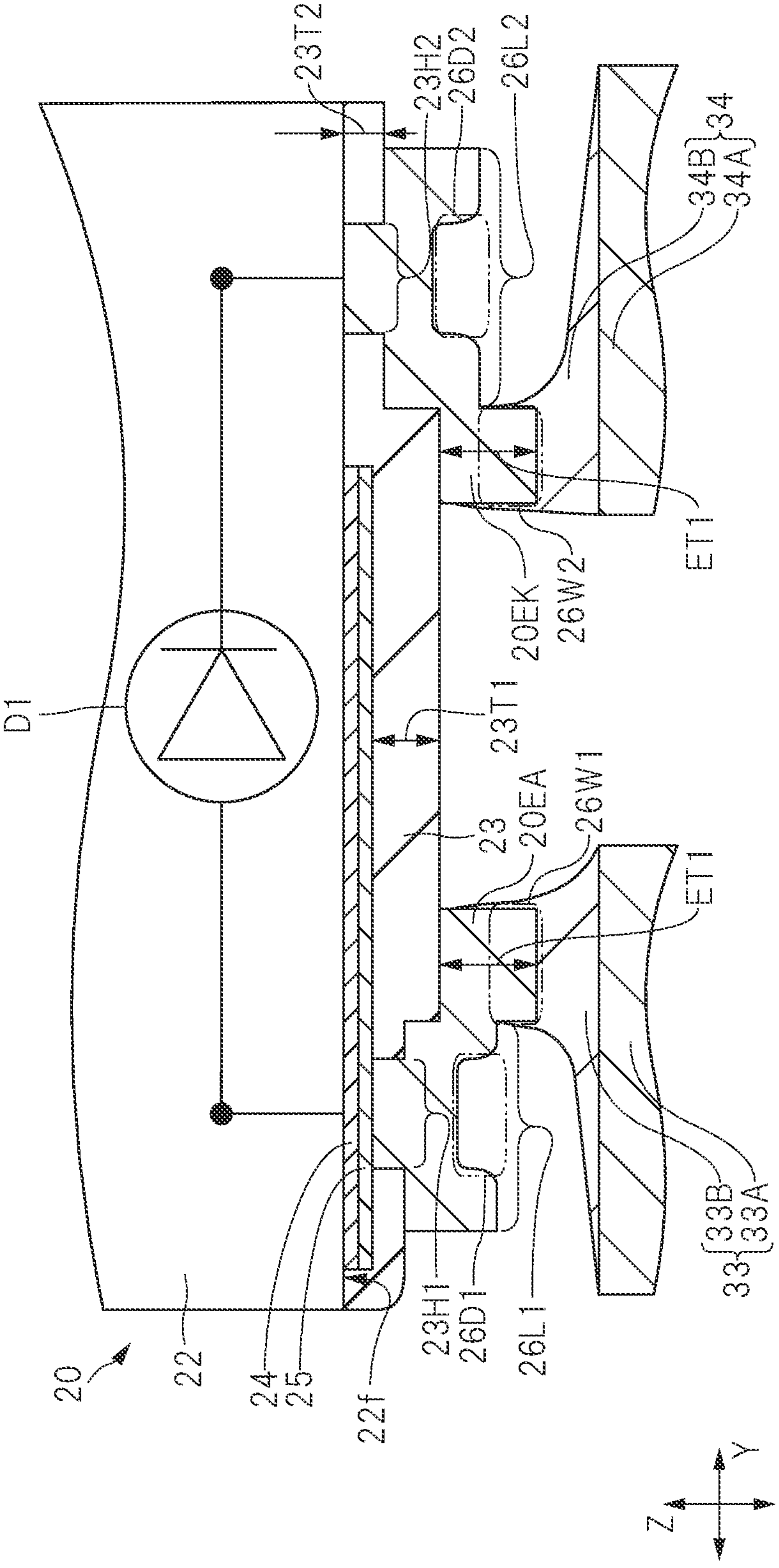
FIG. 5 is an enlarged cross-sectional view showing the vicinity of the electrodes of the LED chip shown in FIG. 4.
Figure 6:
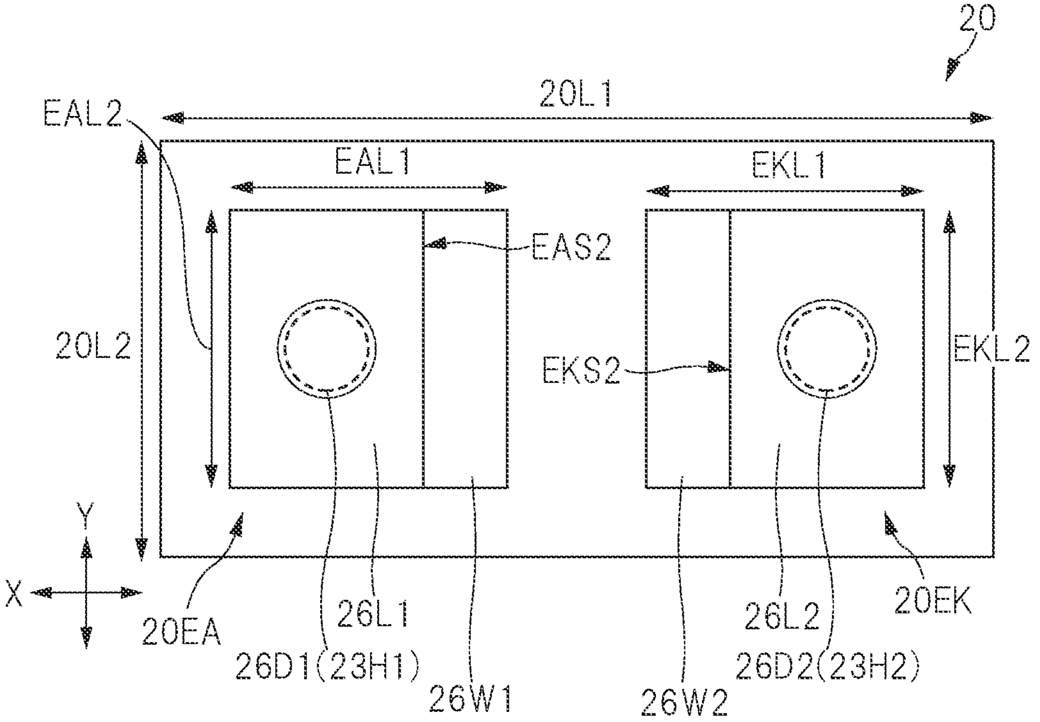
FIG. 6 is a plan view of the LED chip shown in FIG. 5 as viewed from the side of an electrode formation surface.

Next, a peripheral structure of an LED chip arranged in each of the plurality of pixels PIX shown in FIG. 1 will be described. FIG. 3 is a transparent enlarged plan view showing an example of a peripheral structure of an LED chip arranged in each of the plurality of pixels of the display device shown in FIG. 1. In FIG. 3, illustration of an inorganic insulating layer 14 shown in FIG. 4 is omitted. In FIG. 3, outlines of semiconductor layers, electrodes, and scanning signal lines are indicated by dotted lines. FIG. 4 is an enlarged cross-sectional view taken along the line A-A in FIG. 3. FIG. 5 is an enlarged cross-sectional view showing the vicinity of the electrodes of the LED chip shown in FIG. 4. FIG. 6 is a plan view of the LED chip shown in FIG. 5 as viewed from the side of an electrode formation surface.

As shown in FIG. 3, the display device DSP1 has a plurality of pixels PIX including a pixel PIX1 (pixels PIX1, PIX2, and PIX3 in the example shown in FIG. 4). Each of the plurality of pixels PIX has the switching element SW, the LED chip (light emitting diode chip) 20, the wiring 31, and a wiring 32. In each of the pixels PIX1, PIX2, and PIX3, for example, the LED chip 20 that emits visible light of one of red, green, and blue is mounted, and the switching element SW that drives the LED chip 20 is formed. Color display is possible by controlling the output and timing of visible light emitted from the LED chips of the pixels PIX1, PIX2, and PIX3. When the plurality of pixels PIX that emit visible light of different colors are combined in this way, the pixel PIX for each color may be referred to as a sub-pixel, and a set of the plurality of pixels PIX may be referred to as a pixel. In this embodiment, the portion corresponding to the sub-pixel mentioned above is referred to as the pixel PIX.

The wiring 31 is electrically connected to the drain electrode ED of the switching element SW and the anode electrode 20EA of the LED chip 20, respectively. The wiring 32 is connected to a source electrode ES of the switching element SW. In the example shown in FIG. 3, the wiring 32 has a bent structure, one end thereof is connected to the source electrode ES of the switching element SW, and the other end thereof is connected to the wiring VL. The scanning signal line GL is used as the gate electrode EG of the switching element SW.

The display device DSP1 further includes the wiring VL that extends in the Y direction over the plurality of pixels PIX (see FIG. 2) and is electrically connected to the wiring 32 and the wiring VSL that extends in the X direction intersecting (orthogonally in FIG. 3) the Y direction over the plurality of pixels PIX and is electrically connected to the cathode electrode 20EK of the LED chip 20. The wiring VL and the wiring VSL intersect via an insulating layer 41 at a wiring intersection portion LXP shown in FIG. 3. Since the insulating layer 41 is interposed between the wiring VL and the wiring VSL, the wiring VL and the wiring VSL are electrically separated. Note that the layout shown in FIG. 3 is an example, and there are various modifications. For example, as one modification with respect to FIG. 3, a structure in which the switching element SW has a gate electrode (not shown) and the gate electrode is connected to the scanning signal line GL is also possible. In this modification, the scanning signal line GL may be arranged at a position not overlapping a semiconductor layer 50.

As shown in FIG. 4, the display device DSP1 is an electronic device including the substrate 10 made of glass or resin and a plurality of insulating layers stacked in this order on the substrate 10. The plurality of insulating layers provided in the display device DSP1 include an inorganic insulating layer 11, an inorganic insulating layer 12, an inorganic insulating layer 13, and an inorganic insulating layer 14 stacked on the substrate 10. The substrate 10 has the surface 10*f* and the surface 10*b* on a side opposite to the surface 10*f*. Each of the inorganic insulating layers 11, 12, 13, and 14 is stacked on the surface 10*f* of the substrate 10.

The switching element SW includes the inorganic insulating layer 12 formed on the substrate 10, the semiconductor layer 50 formed on the inorganic insulating layer 12, the drain electrode ED connected to a drain region of the semiconductor layer 50, the source electrode ES connected to a source region of the semiconductor layer 50, and the inorganic insulating layer 13 covering the semiconductor layer 50. Each of the wiring 31 and the wiring 32 is, for example, a stacked film of a first conductor layer made of titanium or a titanium alloy and a second conductor layer made of aluminum or an aluminum alloy.

The example shown in FIG. 4 is an example of the bottom-gate structure in which the gate electrode EG is between the semiconductor layer 50 and the substrate 10. In the case of the bottom-gate structure, a portion of the inorganic insulating layer 12 located between the gate electrode EG and the semiconductor layer 50 functions as a gate insulating layer. Further, the inorganic insulating layer 12 functions also as a base layer for forming the semiconductor layer 50. Note that the position of the gate electrode EG is not limited to the example shown in FIG. 4, and the top-gate structure described later may be applied as a modification.

The material constituting each of the inorganic insulating layers 11, 12, 13, and 14 is not particularly limited, and examples of the material include silicon oxide ($SiO_2$) and silicon nitride (SiN). Also, for example, the semiconductor layer 50 is a semiconductor film in which an impurity of a P conductivity type or an N conductivity type is doped in a silicon film made of silicon.

Each of the source electrode ES and the drain electrode ED is a contact plug for making electrical contact with either one of the source region and the drain region of the semiconductor layer 50. The material of the contact plug is, for example, tungsten. As a modification with respect to FIG. 4, contact holes exposing the source region and the drain region of the semiconductor layer 50 may be formed in the inorganic insulating layer 13, and a portion of the wiring 31 and a portion of the wiring 32 may be embedded in the contact holes. In this case, the portions of the wiring 31 and the wiring 32 embedded in the contact holes are in contact with the semiconductor layer 50, and the contact interfaces between the wirings 31 and 32 and the semiconductor layer 50 can be regarded as the drain electrode ED and the source electrode ES.

In addition, as shown in FIG. 4, the display device DSP1 includes a projection electrode 33 and a projection electrode 34. Each of the projection electrode 33 and the projection electrode 34 is a terminal for mounting the LED chip 20 on the substrate 10. One of the two projection electrodes (projection electrode 33 in FIG. 4) is connected to the anode electrode 20EA of the LED chip 20, and the other (projection electrode 34 in FIG. 4) is connected to the cathode electrode 20EK of the LED chip 20.

The projection electrode 33 is connected to the wiring 31 at a position overlapping the opening (contact hole) formed in the inorganic insulating layer 14 and protrudes from the inorganic insulating layer 14. Further, the projection electrode 33 includes a conductor portion 33A formed in a columnar shape and bonded to the wiring 31 and a conductor portion 33B made of solder containing tin and formed on the conductor portion 33A. The metal material constituting the conductor portion 33A is, for example, copper (or copper alloy), titanium, nickel, or a stacked film thereof. By using the conductor portion 33A containing copper or a copper alloy, the electrical characteristics of the projection electrode 33 can be improved. However, as a modification with respect to the present embodiment, the projection electrode 33 made of only a solder material without the conductor portion 33A made of copper may be used.

The projection electrode 34 is connected to the wiring VSL at a position overlapping the opening (contact hole) formed in the inorganic insulating layer 14 and protrudes from the inorganic insulating layer 14. Further, the projection electrode 34 includes a conductor portion 34A formed in a columnar shape and bonded to the wiring VSL and a conductor portion 34B made of solder containing tin and formed on the conductor portion 34A. The metal material constituting the conductor portion 34A is, for example, copper (or copper alloy), titanium, nickel, or a stacked film thereof. By using the conductor portion 34A containing copper or a copper alloy, the electrical characteristics of the projection electrode 34 can be improved. However, as a modification with respect to the present embodiment, the projection electrode 34 made of only a solder material without the conductor portion 34A made of copper may be used.

As shown in FIG. 5, the LED chip 20 includes a semiconductor layer 22 having a diode element D1 formed therein, an insulating layer 23 covering a surface 22*f* of the semiconductor layer 22, the anode electrode 20EA formed on the insulating layer 23, and the cathode electrode formed on the insulating layer 23 so as to be spaced apart from the anode electrode 20EA. Specifically, the semiconductor layer 22 is, for example, an N-type semiconductor layer.

The semiconductor layer 22 is formed as a common base layer for the anode electrode 20EA and the cathode electrode 20EK, and an active layer 24 and a P-type semiconductor layer 25 are stacked on the semiconductor layer 22 on the side of the anode electrode 20EA. Although not shown, a transparent electrode layer is arranged between the P-type semiconductor layer 25 and the anode electrode 20EA in some cases from the viewpoint of reducing the electrical resistance of the connection interface between the P-type semiconductor layer 25 and the anode electrode 20EA. The semiconductor layer 22 and the P-type semiconductor layer 25 on the side of the anode electrode 20EA are covered with the insulating layer 23 which is an inorganic insulating film. The insulating layer 23 is made of, for example, silicon oxide, silicon nitride, or a stacked film thereof. Each of the anode electrode 20EA and the cathode electrode 20EK is a metal film formed by the sputtering method or the plating method. When a metal film is formed by the plating method, a seed layer for forming the metal film is formed as a base layer. Although not shown, the surface of the semiconductor layer 22 on the side opposite to the surface 22*f* is covered with a buffer layer made of gallium nitride.

A contact hole (opening) 23H1 is formed in the insulating layer 23, and the anode electrode 20EA is electrically connected to the anode of the diode element D1 through the contact hole 23H1. Also, a contact hole (opening) 23H2 is formed in the insulating layer 23, and the cathode electrode 20EK is electrically connected to the cathode of the diode element D1 through the contact hole 23H2.

Incidentally, a portion of each of the anode electrode 20EA and the cathode electrode is embedded in the contact hole 23H1 or the contact hole 23H2. Therefore, regardless of whether the anode electrode 20EA and the cathode electrode 20EK are formed by the sputtering method or by the plating method, a recess portion is formed at a position overlapping the contact hole 23H1 or the contact hole 23H2. As shown in FIG. 5, also in the present embodiment, the anode electrode 20EA has a recess portion 26D1 formed at the position overlapping the contact hole 23H1. Similarly, the cathode electrode 20EK has a recess portion 26D2 formed at the position overlapping the contact hole 23H2.

Here, as a studied example with respect to the present embodiment, a method in which the conductor portion 33B of the projection electrode 33 is embedded in the recess portion 26D1 and the conductor portion 34B of the projection electrode 34 is embedded in the recess portion 26D2 when the LED chip 20 is mounted on the substrate 10 (see FIG. 4) is conceivable. However, the studies by the inventor of this application have revealed that a void (space isolated from outside, in other words, region in which air is trapped) is likely to be formed between the electrode of the LED chip and the projection electrode of the substrate 10 in this method. When the void is formed between the electrode of the LED chip and the projection electrode of the substrate 10, the electrical resistance increases around the void. Further, when the mounted display device DSP1 (see FIG. 1) is repeatedly used and a temperature cycle load is applied, the electrode of the LED chip and the projection electrode may peel off from the void. In this way, the void may cause the decrease in the reliability of the electrical connection between the LED chip and the substrate 10.

Therefore, the inventor of this application has studied the technique for suppressing the formation of void, and has found the structure of the present embodiment. As shown in FIG. 5, the anode electrode 20EA has the recess portion 26D1 which is formed at the position overlapping the contact hole 23H1 and does not contact the projection electrode 33 and a protruding portion 26W1 which is formed at a position different from the recess portion 26D1, protrudes in a direction away from the insulating layer 23 than the recess portion 26D1, and is in contact with the projection electrode 33. The cathode electrode 20EK has the recess portion 26D2 which is formed at the position overlapping the contact hole 23H2 and does not contact the projection electrode 34 and a protruding portion 26W2 which is formed at a position different from the recess portion 26D2, protrudes in a direction away from the insulating layer 23 than the recess portion 26D2, and is in contact with the projection electrode 34. The space between the recess portion 26D1 and the projection electrode 33 communicates with the space around the connection portion between the anode electrode 20EA and the projection electrode 33. The space between the recess portion 26D2 and the projection electrode 34 communicates with the space around the connection portion between the cathode electrode 20EK and the projection electrode 34. In other words, the space in the recess portion 26D1 communicates with the space around the anode electrode 20EA, and the space in the recess portion 26D2 communicates with the space around the cathode electrode 20EK.

Each of the protruding portion 26W1 of the anode electrode 20EA and the protruding portion 26W2 of the cathode electrode 20EK functions as a spacer member that suppresses the formation of void in the recess portion 26D1 or the recess portion 26D2. Therefore, the conductor portion 33A of the projection electrode 33 is selectively bonded to the protruding portion 26W1 of the anode electrode 20EA and does not contact the recess portion 26D1. Also, the conductor portion 34A of the projection electrode 34 is selectively bonded to the protruding portion 26W2 of the cathode electrode 20EK and does not contact the recess portion 26D2. As a result, the formation of the void described above can be prevented or suppressed, so that the reliability of electrical connection between the LED chip 20 and the substrate 10 (see FIG. 4) can be improved.

As shown in FIG. 6, the anode electrode 20EA has a flat portion 26L1 which is located between the recess portion 26D1 and the protruding portion 26W1 and is continuous with the recess portion 26D1. Further, the cathode electrode 20EK has a flat portion 26L2 which is located between the recess portion 26D2 and the protruding portion 26W2 and is continues with the recess portion 26D2. As shown in FIG. 5, the flat portion 26L1 does not contact the projection electrode 33, and the flat portion 26L2 does not contact the projection electrode 34. Although not shown, as a modification with respect to FIG. 5 and FIG. 6, the case in which the flat portion 26L1 and the flat portion 26L2 are not formed and the side wall of the recess portion 26D1 (or recess portion 26D2) and the side wall of the protruding portion 26W1 (or protruding portion 26W2) are continuously connected is also possible. However, from the viewpoint of preventing the formation of the void in the vicinity of the recess portion 26D1 and the recess portion 26D2, it is preferable that the flat portion 26L1 and the flat portion 26L2 are provided. By providing the flat portion 26L1 and the flat portion 26L2, it is possible to prevent the conductor portion 33B and the conductor portion 34B made of, for example, solder from wetting and spreading to the recess portion 26D1 and the recess portion 26D2.

In addition, in the example shown in FIG. 6, each of the flat portion 26L1 and the flat portion 26L2 has a quadrangular outer edge surrounding the recess portion 26D1 or the recess portion 26D2 in plan view. The protruding portion 26W1 is formed along at least one side of the four sides of the outer edge of the flat portion 26L1, and the protruding portion 26W2 is formed along at least one side of the four sides of the outer edge of the flat portion 26L2.

Specifically, as in an LED chip 20B shown in FIG. 9 described later, the flat portion 26L1 of the anode electrode 20EA of the LED chip 20 shown in FIG. 6 has a side EAS1 (see FIG. 9) located farthest from the cathode electrode 20EK, a side EAS2 located closest to the cathode electrode 20EK, a side EAS3 (see FIG. 9) intersecting the side EAS1 and the side EAS2, and a side EAS4 (see FIG. 9) located on the side opposite to the side EAS3. Similarly, the flat portion 26L2 of the cathode electrode 20EK of the LED chip 20 has a side EKS1 (see FIG. 9) located farthest from the anode electrode 20EA, a side EKS2 located closest to the anode electrode 20EA, a side EKS3 (see FIG. 9) intersecting the side EKS1 and the side EKS2, and a side EKS4 (see FIG. 9) located on the side opposite to the side EKS3. In FIG. 6, reference characters are applied to only the side EAS2 and the side EKS2 for ease of viewing.

In the case of the example shown in FIG. 5 and FIG. 6, the protruding portion 26W1 is formed along only the side EAS2 closest to the flat portion 26L2 of the four sides of the outer edge of the flat portion 26L1. Also, the protruding portion 26W2 is formed along only the side EKS2 closest to the flat portion 26L1 of the four sides of the outer edge of the flat portion 26L2. The structure shown in FIG. 5 and FIG. 6 can be easily formed by increasing the thickness of the portion of the insulating layer 23 which is arranged between the anode electrode 20EA and the cathode electrode 20EK in FIG. 5. As shown in FIG. 5, a thickness 23T1 of the portion of the insulating layer 23 located between the anode electrode 20EA and the cathode electrode 20EK is larger than a thickness 23T2 of the portion of the insulating layer 23 located outside the cathode electrode 20EK (in other words, the portion located between the cathode electrode 20EK and the outer edge of the LED chip 20). Each of the protruding portion 26W1 and the protruding portion 26W2 is formed on the portion having the larger thickness. In this way, it is possible to easily form the protruding portion 26W1 and the protruding portion 26W2 without changing the thickness of the metal film itself used as the anode electrode 20EA and the cathode electrode 20EK.

The insulating layer 23 having a portion with a selectively large thickness can be formed by the following method. For example, after forming an insulating layer with the thickness 23T2, another insulating layer with a thickness approximately equal to the thickness 23T2 is formed between the regions where the anode electrode 20EA and the cathode electrode 20EK are formed, respectively. Thereafter, the metal film constituting the anode electrode 20EK and the cathode electrode 20EK is formed such that the anode electrode 20EA and the cathode electrode 20EK partially overlap the thick portion of the insulating layer 23, whereby the structure shown in FIG. 5 and FIG. 6 can be obtained.

In addition to the method of forming the protruding portion 26W1 and the protruding portion 26W2 by increasing the film thickness of a portion of the insulating layer 23 as described above, it is also possible to apply the method of making portions of the metal film constituting the anode electrode 20EA and the cathode electrode 20EK thicker than the other portions. Namely, the film thickness of the metal film of the portions to be the protruding portion 26W1 and the protruding portion 26W2 is made larger than the film thickness of the metal film of the other portions of the electrodes. In this way, the protruding portions can be formed even if the thickness of the insulating layer 23 is uniform. However, it is easier to apply the method of controlling the film thickness of the insulating layer 23.

Further, as a modification of the method of forming the insulating layer 23, the following method can be presented. That is, after forming an insulating layer with the thickness 23T1, etching is performed to the peripheral region of the LED chip 20. As a result, the film thickness of the peripheral region is reduced to the thickness 23T2. The method of forming the anode electrode 20EA and the cathode electrode 20EK is the same as that described above. As described above, the structure shown in FIG. 5 and FIG. 6 can be formed by the relatively simple process.

Examples of the dimensions of each member shown in FIG. 5 and FIG. 6 are as follows. First, the thickness 23T1 of the insulating layer 23 shown in FIG. 5 is about 1 μm to several μm (5 μm or less). The thickness 23T2 is smaller than the thickness 23T1 and is about 40 to 60% of the thickness 23T1. Also, a thickness ET1 of the metal film constituting the anode electrode 20EA and the cathode electrode 20EK is about several μm (5 μm or less). However, the thickness ET1 is at least larger than the thickness 23T2 of the insulating layer 23 and is larger than the difference between the thickness 23T1 and the thickness 23T2. Further, the thickness ET1 is preferably larger than the thickness 23T1. In this way, the electrode can be formed over the thick portion and the thin portion of the insulating layer 23. Note that the overall thickness of the LED chip 20 is about 10 μm or less.

Also, in the example shown in FIG. 6, the LED chip 20 is quadrangular (specifically, rectangular) in plan view. A length 20L1 of the LED chip 20 in the X direction is about several μm to 50 μm. Also, a length 20L2 of the LED chip 20 in the Y direction is, for example, about half the length 20L1. The anode electrode 20EA and the cathode electrode 20EK have the same size. For example, a length EAL1 and a length EKL1 of the anode electrode 20EA and the cathode electrode 20EK in the X direction are each smaller than half the length 20L1 of the LED chip 20 (for example, about several μm to 20 μm). A length EAL2 and a length EKL2 of the anode electrode 20EA and the cathode electrode 20EK are each smaller than the length 20L2 of the LED chip 20

(for example, about several μm to 20 μm). Further, diameters of the contact hole 23H1 and the contact hole 23H2 are, for example, about 1 μm to several μm (5 μm or less).

Modification

Figure 7:
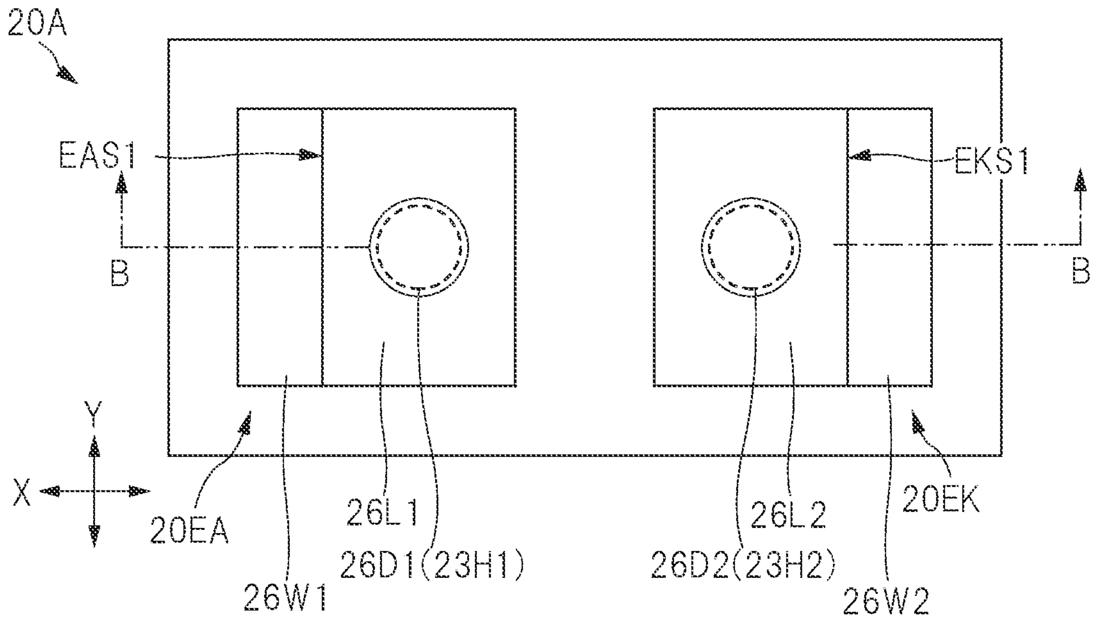
FIG. 7 is a plan view of an LED chip in a modification with respect to FIG. 6.
Figure 8:
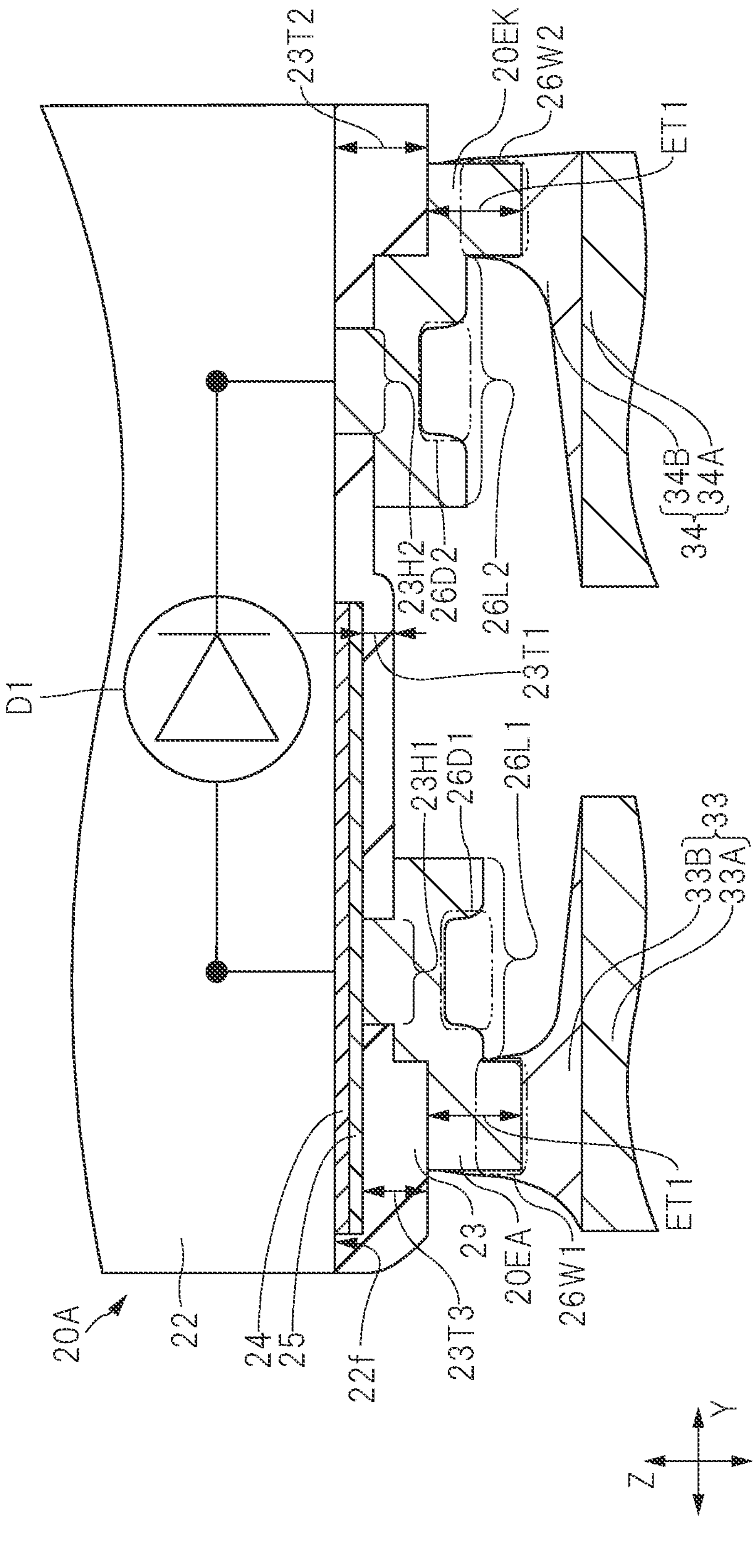
FIG. 8 is an enlarged cross-sectional view showing the state in which the LED chip is mounted on the substrate in a cross-sectional view taken along the line B-B in FIG. 7.

Next, modifications with respect to the LED chip shown in FIG. 5 and FIG. 6 will be described. FIG. 7 is a plan view of an LED chip in a modification with respect to FIG. 6. FIG. 8 is an enlarged cross-sectional view showing the state in which the LED chip is mounted on the substrate in a cross-sectional view taken along the line B-B in FIG. 7. An LED chip 20A shown in FIG. 7 and FIG. 8 differs from the LED chip 20 shown in FIG. 5 and FIG. 6 in the positions of the protruding portion 26W1 and the protruding portion 26W2. In the following, differences from the embodiment described with reference to FIG. 5 and FIG. 6 will be mainly described, and descriptions of common parts will be omitted.

The protruding portion 26W1 shown in FIG. 7 is formed along only the side EAS1 farthest from the flat portion 26L2 of the four sides of the outer edge of the flat portion 26L1. The protruding portion 26W2 is formed along only the side EKS1 farthest from the flat portion 26L1 of the four sides of the outer edge of the flat portion 26L2. Specifically, as in the LED chip 20B shown in FIG. 9 described later, the flat portion 26L1 of the anode electrode 20EA of the LED chip 20A shown in FIG. 7 has the side EAS1 located farthest from the cathode electrode 20EK, the side EAS2 (see FIG. 9) located closest to the cathode electrode 20EK, the side EAS3 (see FIG. 9) intersecting the side EAS1 and the side EAS2, and the side EAS4 (see FIG. 9) located on the side opposite to the side EAS3. Similarly, the flat portion 26L2 of the cathode electrode 20EK of the LED chip 20A has the side EKS1 located farthest from the anode electrode 20EA, the side EKS2 (see FIG. 9) located closest to the anode electrode 20EA, the side EKS3 (see FIG. 9) intersecting the side EKS1 and the side EKS2, and the side EKS4 (see FIG. 9) located on the side opposite to the side EKS3. In FIG. 7, reference characters are applied to only the side EAS1 and the side EKS1 for ease of viewing.

In the case of the LED chip 20A, as shown in FIG. 8, the thickness 23T1 of the portion of the insulating layer 23 located between the anode electrode 20EA and the cathode electrode 20EK is smaller than the thickness 23T2 of the portion of the insulating layer 23 outside the cathode electrode 20EK (in other words, the portion located between the cathode electrode 20EK and the outer edge of the LED chip 20A). Also, the thickness 23T1 of the portion of the insulating layer 23 located between the anode electrode 20EA and the cathode electrode 20EK is smaller than a thickness 23T3 of the portion of the insulating layer 23 outside the anode electrode 20EA (in other words, the portion located between the anode electrode 20EA and the outer edge of the LED chip 20A).

In the case of the LED chip 20A of this modification, the separation distance between the protruding portion 26W1 and the protruding portion 26W2 can be increased as compared with the LED chip 20 shown in FIG. 6. In this case, even when the distance between the anode electrode 20EA and the cathode electrode 20EK is shortened, the short-circuiting between the anode electrode 20EA and the cathode electrode 20EK through the conductor portion 33B of the projection electrode 33 and the conductor portion 34B of the projection electrode 34 can be prevented. In addition, in the case of the LED chip 20A, as shown in FIG. 8, the electrode and the projection electrode are bonded near the outer edge of the LED chip 20A. Therefore, the strength for fixing the LED chip 20A onto the substrate 10 (see FIG. 4) can be improved.

Figure 9:
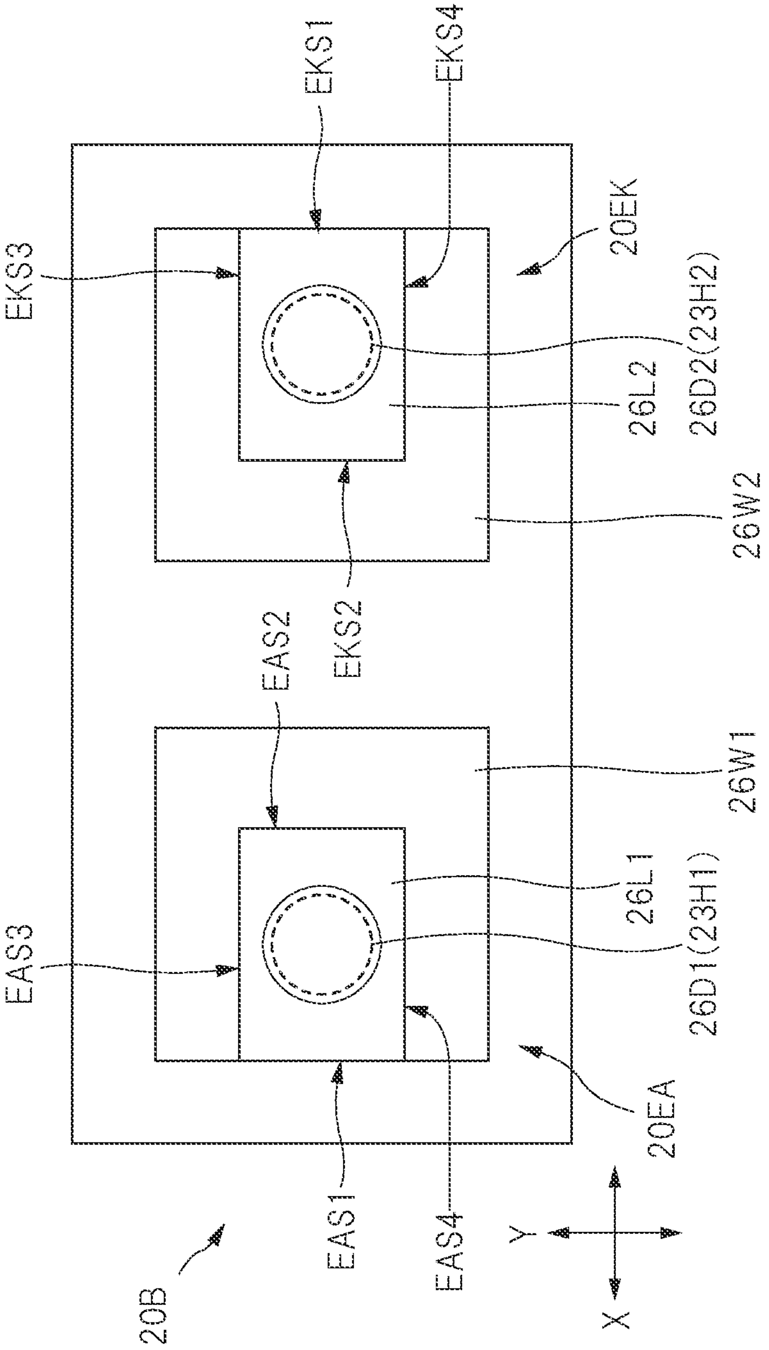
FIG. 9 is a plan view showing another modification with respect to FIG. 6.
Figure 10:
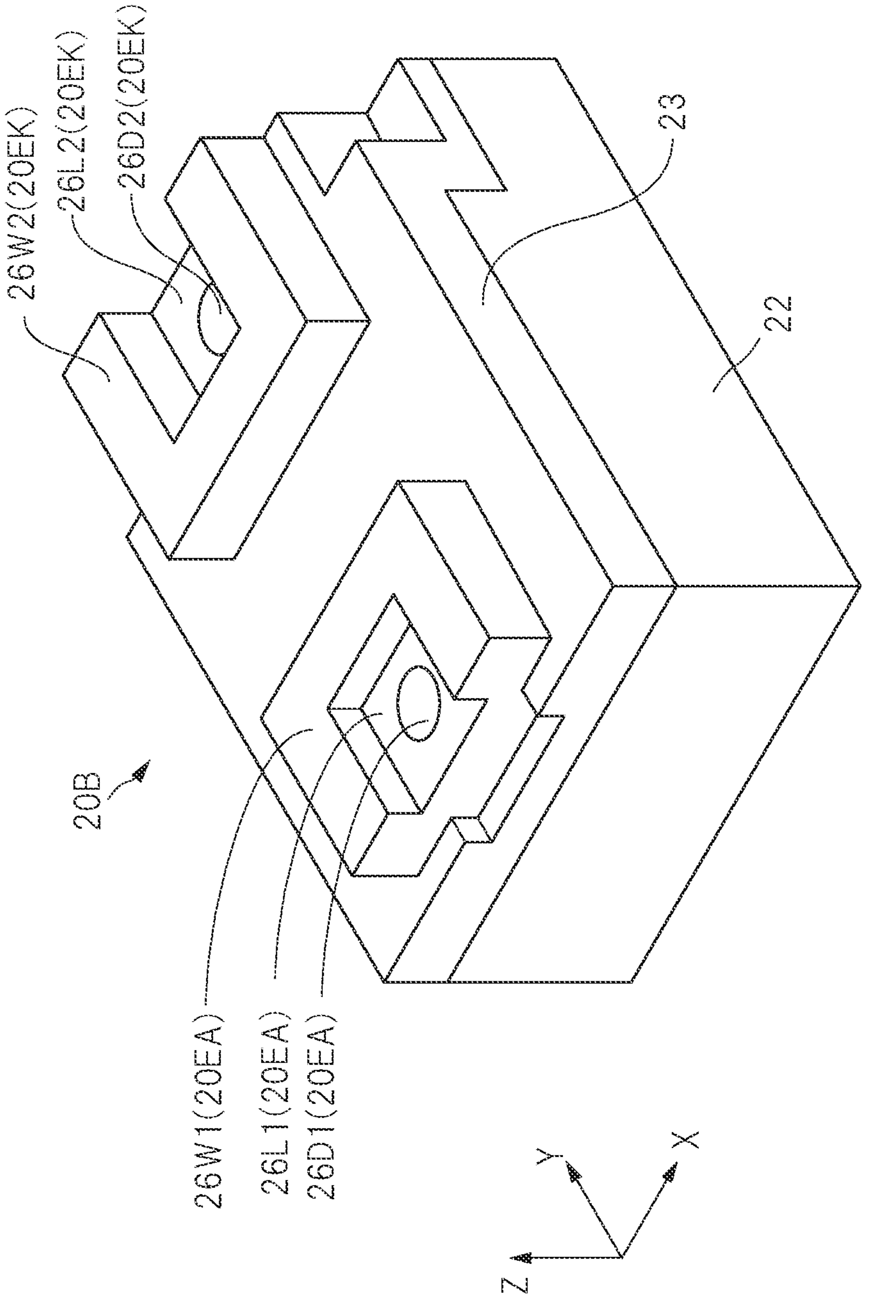
FIG. 10 is a perspective view of the LED chip shown in FIG. 9.

FIG. 9 is a plan view showing another modification with respect to FIG. 6. FIG. 10 is a perspective view of the LED chip shown in FIG. 9. Since a cross-sectional view when the LED chip shown in FIG. 9 is mounted on the substrate 10 shown in FIG. 4 is the same as that shown in FIG. 5, redundant illustration is omitted. The LED chip 20B shown in FIG. 9 differs from the LED chip 20 shown in FIG. 5 and FIG. 6 in the shapes of the protruding portion 26W1 and the protruding portion 26W2. In the following, differences from the embodiment described with reference to FIG. 5 and FIG. 6 will be mainly described, and descriptions of common parts will be omitted.

The protruding portion 26W1 shown in FIG. 9 is formed along a plurality of sides of the four sides of the outer edge of the flat portion 26L1. The protruding portion 26W2 is formed along a plurality of sides of the four sides of the outer edge of the flat portion 26L2. In the example shown in FIG. 9, the protruding portion 26W1 is formed along three sides of the four sides of the outer edge of the flat portion 26L1 other than the side EAS1 so as to surround the flat portion 26L1. The protruding portion 26W2 is formed along three sides of the four sides of the outer edge of the flat portion 26L2 other than the side EKS1 so as to surround the flat portion 26L2. However, as a modification, the protruding portion 26W1 and the protruding portion 26W2 may be formed along any of the two sides of the four sides.

As shown in FIG. 9, the flat portion 26L1 of the anode electrode 20EA of the LED chip 20B has the side EAS1 located farthest from the cathode electrode 20EK, the side EAS2 located closest to the cathode electrode 20EK, the side EAS3 intersecting the side EAS1 and the side EAS2, and the side EAS4 located on the side opposite to the side EAS3. Similarly, the flat portion 26L2 of the cathode electrode 20EK of the LED chip 20B has the side EKS1 located farthest from the anode electrode 20EA, the side EKS2 located closest to the anode electrode 20EA, the side EKS3 intersecting the side EKS1 and the side EKS2, and the side EKS4 located on the side opposite to the side EKS3.

The protruding portion 26W1 is arranged around the flat portion 26L1 along each of the sides EAS2, EAS3, and EAS4 of the four sides of the flat portion 26L1. The protruding portion 26W2 is arranged around the flat portion 26L2 along each of the sides EKS2, EKS3, and EKS4 of the four sides of the flat portion 26L2.

When the protruding portion 26W1 is formed along a plurality of sides of the flat portion 26L1 as in this modification, the contact area between the conductor portion 33B (see FIG. 5) of the projection electrode 33 (see FIG. 5) and the protruding portion 26W1 can be increased. As a result, the bonding strength can be improved as compared with the example shown in FIG. 6. Moreover, since the area of the path through which electricity flows can be increased, the resistance value of the current path can be reduced.

Similarly, when the protruding portion 26W2 is formed along a plurality of sides of the flat portion 26L2, the contact area between the conductor portion 34B (see FIG. 5) of the projection electrode 34 (see FIG. 5) and the protruding portion 26W2 can be increased. As a result, the bonding strength can be improved as compared with the example shown in FIG. 6. Moreover, since the area of the path through which electricity flows can be increased, the resistance value of the current path can be reduced.

Further, from the viewpoint of improving the strength of the joint portion, it is particularly preferable that the protruding portion 26W1 (or protruding portion 26W2) is formed along the three sides of the four sides of the flat portion 26L1 (or flat portion 26L2) as in the LED chip 20B shown in FIG. 9. In the case of this modification, durability can be improved even when an external force is applied from any direction within the X-Y plane including the X direction and the Y direction.

In the foregoing, the embodiment and typical modifications have been described. However, the technique described above can be applied to various modifications other than the above-described modifications. For example, the above-described modifications may be combined.

A person having ordinary skill in the art can make various alterations and corrections within a range of the idea of the present invention, and it is interpreted that the alterations and corrections also belong to the scope of the present invention. For example, the embodiments obtained by performing addition or elimination of components or design change or the embodiments obtained by performing addition or reduction of process or condition change to the embodiments described above by a person having an ordinary skill in the art are also included in the scope of the present invention as long as they include the gist of the present invention.

The present invention can be applied to display devices and electronic devices incorporating display devices.

What is claimed is:

1. A display device comprising:

a substrate having a first projection electrode and a second projection electrode; and a light emitting diode chip which has a first electrode arranged at a position facing the first projection electrode and a second electrode arranged at a position facing the second projection electrode and is mounted on the substrate, wherein the light emitting diode chip includes:

a semiconductor layer;

a first insulating layer covering a first surface of the semiconductor layer;

the first electrode formed on the first insulating layer; and the second electrode formed on the first insulating layer so as to be spaced apart from the first electrode, wherein the first electrode is one of an anode and a cathode of a diode element and is disposed in a first contact hole formed in the first insulating layer, wherein the second electrode is the other of the anode and the cathode of the diode element and is disposed in a second contact hole formed in the first insulating layer, wherein the first electrode includes:

a first recess portion which is formed at a position overlapping the first contact hole and does not contact the first projection electrode; and a first protruding portion protrudes in a direction away from the first insulating layer, and is in contact with the first projection electrode, wherein the second electrode includes:

a second recess portion which is formed at a position overlapping the second contact hole and does not contact the second projection electrode; and a second protruding portion protrudes in a direction away from the first insulating layer, and is in contact with the second projection electrode, wherein a space between the first recess portion and the first projection electrode communicates with a space around a connection portion between the first electrode and the first projection electrode, wherein a space between the second recess portion and the second projection electrode communicates with a space around a connection portion between the second electrode and the second projection electrode, wherein the first electrode has a first flat portion which is located between the first recess portion and the first protruding portion and is continuous with the first recess portion, wherein the second electrode has a second flat portion which is located between the second recess portion and the second protruding portion and is continuous with the second recess portion, wherein, in a plan view, each of the first flat portion and the second flat portion has a quadrangular outer edge surrounding the first recess portion or the second recess portion, wherein the first protruding portion is formed along at least one side of four sides of the outer edge of the first flat portion, and wherein the second protruding portion is formed along at least one side of four sides of the outer edge of the second flat portion.

2. The display device according to claim 1, wherein the first protruding portion is formed along only a first side farthest from the second flat portion of the four sides of the outer edge of the first flat portion, and wherein the second protruding portion is formed along only a second side farthest from the first flat portion of the four sides of the outer edge of the second flat portion.

3. The display device according to claim 1, wherein the first protruding portion is formed along a plurality of sides of the four sides of the outer edge of the first flat portion, and wherein the second protruding portion is formed along a plurality of sides of the four sides of the outer edge of the second flat portion.

4. The display device according to claim 3, wherein the first protruding portion is formed along three sides other than a first side of the four sides of the outer edge of the first flat portion so as to surround the first flat portion, and wherein the second protruding portion is formed along three sides other than a second side of the four sides of the outer edge of the second flat portion so as to surround the second flat portion.

5. The display device according to claim 4, wherein the first side of the first flat portion is a side farthest from the second flat portion of the four sides of the outer edge of the first flat portion, and wherein the second side of the second flat portion is a side farthest from the first flat portion of the four sides of the outer edge of the second flat portion.

6. The display device according to claim 1, wherein the first protruding portion is formed along only a first side closest to the second flat portion of the four sides of the outer edge of the first flat portion, wherein the second protruding portion is formed along only a second side closest to the first flat portion of the four sides of the outer edge of the second flat portion, and wherein a first thickness of a first portion of the first insulating layer between the first electrode and the second electrode is larger than a second thickness of a second portion of the first insulating layer between the second electrode and an outer edge of the light emitting diode chip.

7. A light emitting diode chip comprising:
a semiconductor layer in which a diode element is formed;
a first insulating layer covering a first surface of the semiconductor layer;
a first electrode formed on the first insulating layer; and
a second electrode formed on the first insulating layer so as to be spaced apart from the first electrode,
wherein the first electrode is one of an anode and a cathode of the diode element and is disposed in a first contact hole formed in the first insulating layer,
wherein the second electrode is the other of the anode and the cathode of the diode element and is disposed in a second contact hole formed in the first insulating layer,
wherein the first electrode includes:
a first recess portion which is formed at a position different from the first contact hole; and
a first protruding portion protrudes in a direction away from the first insulating layer,
wherein the second electrode includes:
a second recess portion which is formed at a position different from the second contact hole; and
a second protruding portion protrudes in a direction away from the first insulating layer,
wherein a space in the first recess portion communicates with a space around the first electrode,
wherein a space in the second recess portion communicates with a space around the second electrode,
wherein the first electrode has a first flat portion which is located between the first recess portion and the first protruding portion and is continuous with the first recess portion,
wherein the second electrode has a second flat portion which is located between the second recess portion and the second protruding portion and is continuous with the second recess portion,
wherein, in a plan view, each of the first flat portion and the second flat portion has a quadrangular outer edge surrounding the first recess portion or the second recess portion,
wherein the first protruding portion is formed along at least one side of four sides of the outer edge of the first flat portion,
wherein the second protruding portion is formed along at least one side of four sides of the outer edge of the second flat portion.

8. The light emitting diode chip according to claim 7,
wherein the first protruding portion is formed along only a first side farthest from the second flat portion of the four sides of the outer edge of the first flat portion, and
wherein the second protruding portion is formed along only a second side farthest from the first flat portion of the four sides of the outer edge of the second flat portion.

9. The light emitting diode chip according to claim 7,
wherein the first protruding portion is formed along a plurality of sides of the four sides of the outer edge of the first flat portion, and
wherein the second protruding portion is formed along a plurality of sides of the four sides of the outer edge of the second flat portion.

10. The light emitting diode chip according to claim 9,
wherein the first protruding portion is formed along three sides other than a first side of the four sides of the outer edge of the first flat portion so as to surround the first flat portion, and
wherein the second protruding portion is formed along three sides other than a second side of the four sides of the outer edge of the second flat portion so as to surround the second flat portion.

11. The light emitting diode chip according to claim 10,
wherein the first side of the first flat portion is a side farthest from the second flat portion of the four sides of the outer edge of the first flat portion, and
wherein the second side of the second flat portion is a side farthest from the first flat portion of the four sides of the outer edge of the second flat portion.

12. The light emitting diode chip according to claim 7,
wherein the first protruding portion is formed along only a first side closest to the second flat portion of the four sides of the outer edge of the first flat portion,
wherein the second protruding portion is formed along only a second side closest to the first flat portion of the four sides of the outer edge of the second flat portion, and
wherein a first thickness of a first portion of the first insulating layer between the first electrode and the second electrode is larger than a second thickness of a second portion of the first insulating layer between the second electrode and an outer edge of the light emitting diode chip.

* * * * *